United States Patent
Cowan et al.

(10) Patent No.: US 6,882,159 B1
(45) Date of Patent: Apr. 19, 2005

(54) ASSOCIATED GROUPING OF EMBEDDED CORES FOR MANUFACTURING TEST

(75) Inventors: Bruce Cowan, Essex Junction, VT (US); Kelly A. Ockunzzi, Essex Junction, VT (US); Jessica H. Pratt, Colchester, VT (US); Mark R. Taylor, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/707,172

(22) Filed: Nov. 25, 2003

(51) Int. Cl.⁷ .............................................. G01R 31/01

(52) U.S. Cl. ........................................ 324/537; 324/765
(58) Field of Search ............................. 438/10, 11, 17, 438/18; 324/537, 763, 764, 765; 702/57, 58, 117, 118, 121

*Primary Examiner*—Evan Pert
(74) *Attorney, Agent, or Firm*—Schmeiser, Olsen & Watts; Robert A. Walsh

(57) ABSTRACT

A structure and associated method for associated grouping of an alpha device with a plurality of dependent devices for a manufacturing test. The alpha device comprises at least one electrical characteristic. The plurality of dependent devices each comprise the at least one electrical characteristic. The alpha device and the plurality dependent devices are grouped together within a semiconductor device for an associated manufacturing test.

20 Claims, 5 Drawing Sheets

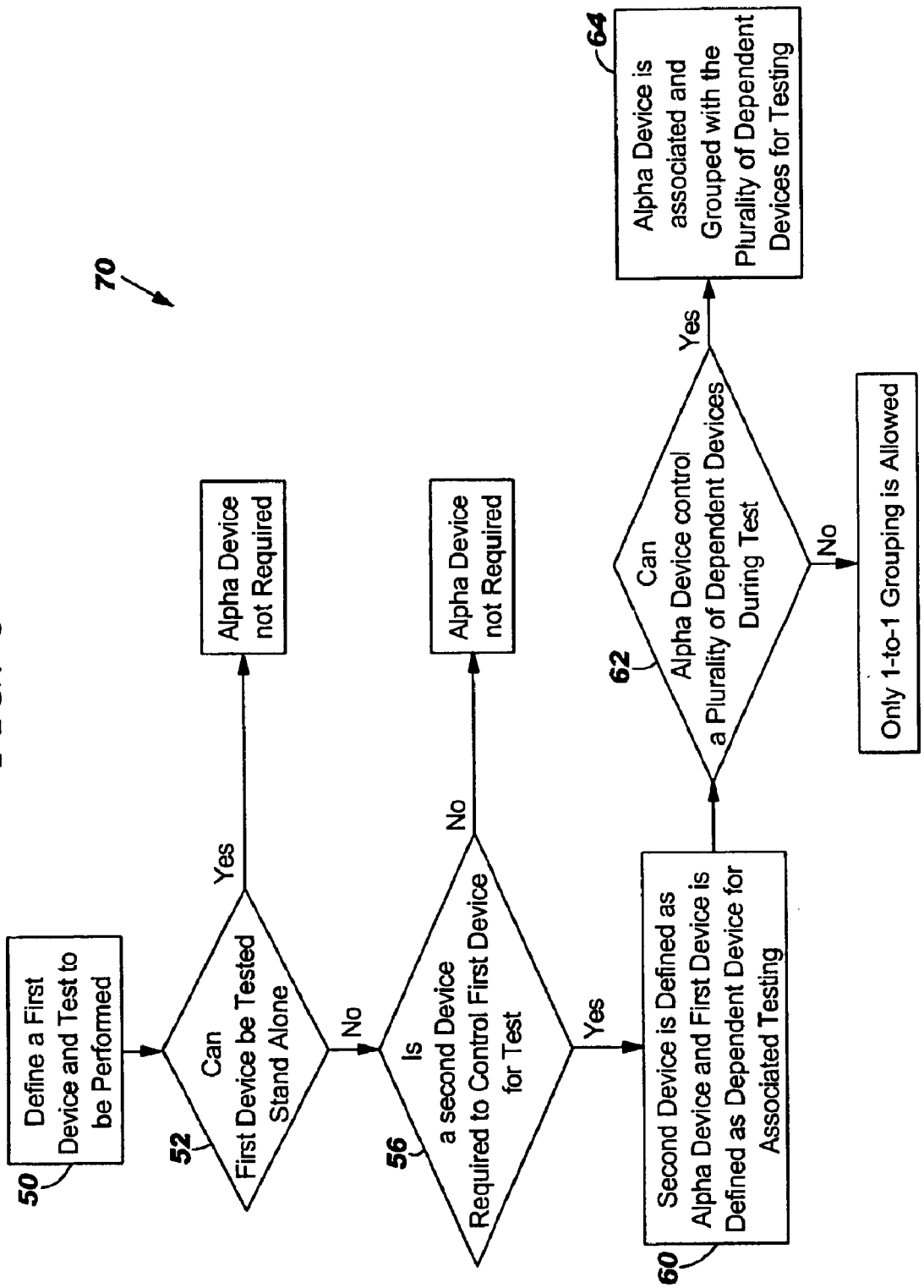

ASSOCIATED GROUPING OF EMBEDDED CORES FOR MANUFACTURING TEST

BACKGROUND OF INVENTION

1. Technical Field

The present invention relates to a structure and associated method to associatively group a plurality of cores for a manufacturing test.

2. Related Art

Electrical devices are typically required to operate within design specifications. If an electrical device does not operate within design specifications, the electrical device may malfunction and require replacement which may be costly. Therefore there exists a need to verify that the electrical device is operating within design specifications.

SUMMARY OF INVENTION

The present invention provides an electrical structure comprising an alpha device comprising at least one electrical characteristic; and a plurality of dependent devices comprising the at least one electrical characteristic, wherein the alpha device and the plurality dependent devices are grouped together within a semiconductor device for an associated manufacturing test.

The present invention provides an a method, comprising:

identifying at least one electrical characteristic for an alpha device;

identifying the at least one electrical characteristic for a plurality of dependent devices; and identifying a group comprising the alpha device and the plurality dependent devices comprising the at least one electrical characteristic for associated manufacturing testing.

The present invention advantageously provides a structure and associated method to associatively verify that an electrical device is operating within design specifications.

BRIEF DESCRIPTION OF DRAWINGS

FIG. 5 illustrates a flowchart showing a process for determining associative grouping for FIGS. 1–4, in accordance with embodiments of the present invention

DETAILED DESCRIPTION

Figure 1:
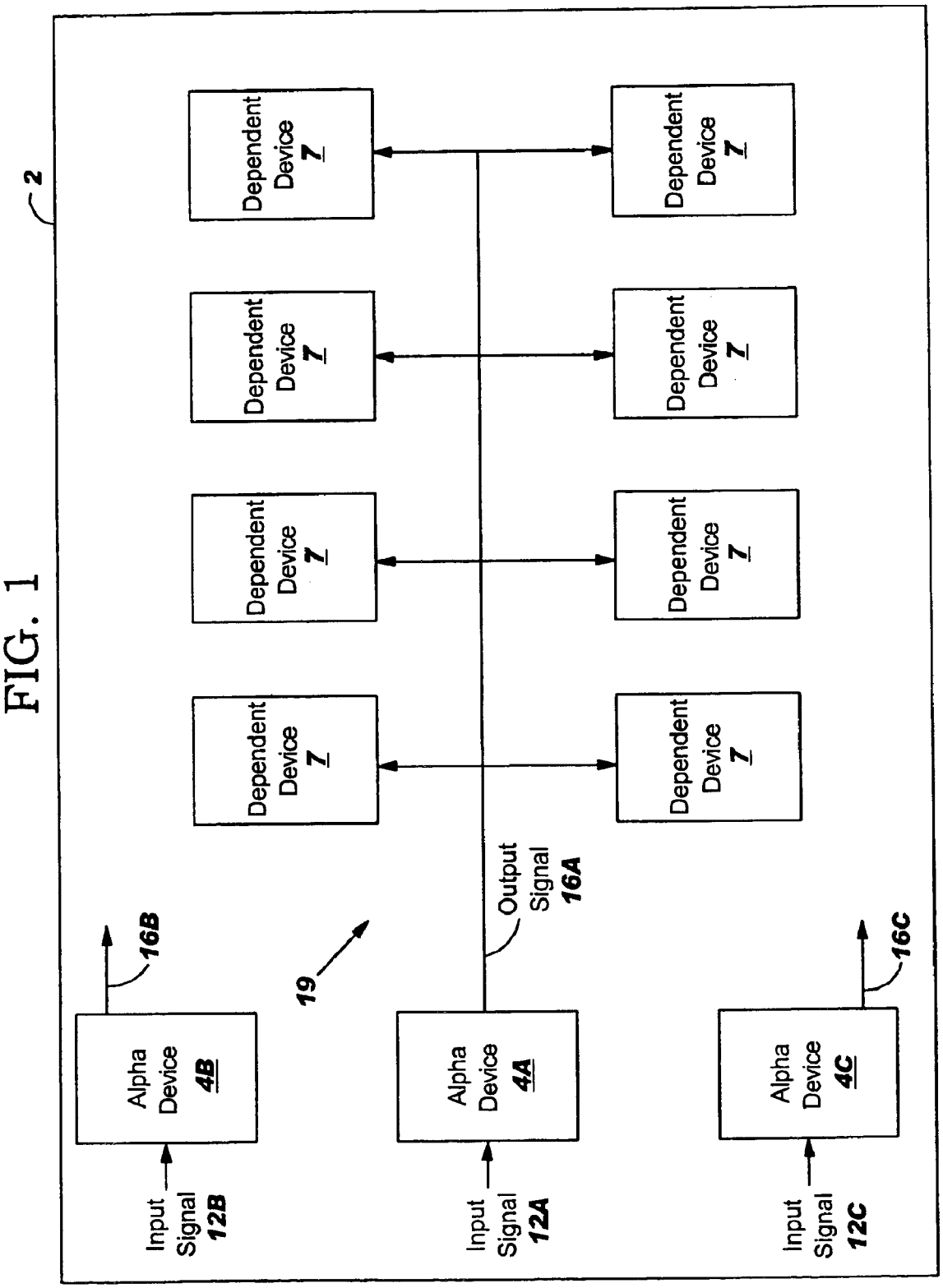
FIG. 1 illustrates a block diagram showing a group comprising an alpha device electrically connected to a plurality of dependent devices for a manufacturing test, in accordance with embodiments of the present invention.

FIG. 1 illustrates a block diagram showing an associative group 19 comprising an alpha device 4A electrically connected to a plurality of dependent devices 7 for a manufacturing test, in accordance with embodiments of the present invention. The manufacturing test is defined herein and in the claims as a procedure to operationally test electrical devices for functionality during a manufacturing process and prior to functionally connecting the electrical devices for a final product designed for a specific use (e.g., testing individual circuits on an integrated circuit during manufacturing prior to producing the integrated circuit). An associative group is defined herein as a group comprising an alpha device and a plurality of dependent devices, wherein the alpha device and the plurality of dependent devices all comprise equivalent electrical characteristics. The alpha device 4A and the plurality of dependent devices 7 are electrical devices. The alpha device 4A is required for operation of the plurality of dependent devices 7 during the manufacturing test. The alpha device 4A is adapted to accept an input signal 12A (e.g., input frequency) and apply an output control signal 16A (i.e., output frequency) to the plurality of dependent devices 7 during the manufacturing test. The Alpha device 4A and the plurality of dependent devices 7 are cores embedded within a semiconductor device 2. A core is defined herein as a functional area on a semiconductor device adapted to perform a specific function (s). The semiconductor device 2 may be any semiconductor device known to a person of ordinary skill in the art including, inter alia, an application specific integrated circuit (ASIC), etc. Alpha devices 4B and 4C are cores embedded within the semiconductor device 2. The alpha devices 4B and 4C may be electrically connected to other dependent devices or cores (i.e., logic devices) on the semiconductor device 2. The alpha devices 4B and 4C may be used to run the other dependent devices or cores (i.e., logic devices) on the semiconductor device 2. The alpha device 4B is adapted to accept an input signal 12B (e.g., input frequency) and apply an output control signal 16B (i.e., output frequency) to any associated dependent devices. The alpha device 4C is adapted to accept an input signal 12C (e.g., input frequency) and apply an output control signal 16C (i.e., output frequency) to any associated dependent devices. The input signals 12A, 12B, and 12C are equivalent signals (e.g., same frequency). The output control signals 16A, 16B, and 16C are equivalent signals (e.g., same frequency). The alpha devices 4A, 4B, and 4C may be, inter alia, phase lock loop (PLL) circuits (devices), digital to analog convertor (DAC), analog to digital convertor (ADC), BIST engine, etc. Each of the plurality of dependent devices 7 may be, inter alia, an input/output (I/O) device, random access memory (RAM), etc. The I/O device may be, inter alia, a serializer/deserializer (SerDes). The alpha devices 4A, 4B, and 4C in FIG. 1 are equivalent devices (i.e., they comprise the same electrical characteristics). Electrical characteristics may be defined as, inter alia, operational frequency of cores, speed at which cores run, jitter tolerance of cores, etc. The plurality of dependent devices 7 are equivalent devices (i.e., they each comprise the same electrical characteristics). The manufacturing test may be designed such that the plurality of dependent devices 7 are tested simultaneously in parallel. Alternatively, the manufacturing test may be designed such that the plurality of dependent devices 7 are tested individually. The manufacturing test is used to test functionality and design specifications of the plurality of dependent devices 7. The alpha device 4A is used to control or allow operation of the plurality of dependent devices 7 during the manufacturing test. To fulfil requirements for a proper manufacturing test, the alpha device 4A must be compatible with the plurality of dependent devices 7 (i.e., must comprise the same electrical characteristics). Additionally, pin to pin connections (operational) between the alpha device 4A and the plurality of dependent devices 7 must be known. The alpha device may be electrically disconnected from the plurality dependent devices upon completion of the associated manufacturing testing. An example of a manufacturing test is described by the following paragraph.

Assume for the following test that the alpha devices 4A, 4B, and 4C are each equivalent high speed PLL circuits (i.e. speed (e.g., 8×speed) at which PLL circuit ramps up input frequency (input signals 12A, 12B, and 12C) to output frequency (output control signals 16A, 16B, and 16C),). Additionally, each of the plurality of dependent devices 7 is a serializer/deserializer (SerDes) requiring a high frequency signal (i.e., output signal 16A) to operate. The semiconductor device 2 is an ASIC. High frequency is defined herein as a frequency selected from a range of about 1 gigahertz to about 6 gigahertz. The manufacturing test is designed to test that the SerDes will properly operate at a specific frequency (i.e., frequency of output control signal 16A from the PLL circuit (alpha device 4A)). Proper operation of the SerDes includes passing a signal (e.g., data) between an input and an output of the SerDes and at a speed at which the signal is passed between the input and the output of the SerDes. If the SerDes are found to be operational within design tolerances then the manufacturing test is over and each SerDes may be disconnected from the PLL and reconnected to any associated circuitry on the ASIC to perform their intended (i.e., designed) function.

The present invention is a method of associative grouping an alpha device (e.g., alpha device 4A) with associated dependent devices (e.g., the plurality of dependent devices 7) for a manufacturing test. The alpha devices 4A, 4B, and 4C in FIG. 1 are equivalent so any of the alpha devices 4A, 4B, and 4C could have been grouped with the plurality of dependent devices 7 (e.g., alpha devices 4A, 4B, and 4C could be interchanged). Therefore, the method of associated grouping is not required for FIG. 1 since any combination of alpha devices and dependent devices will work. A problem arises when a semiconductor device comprises a plurality of alpha devices each comprising different electrical properties. In this instance the method of associated grouping is required as described in the description of FIG. 2.

Figure 2:
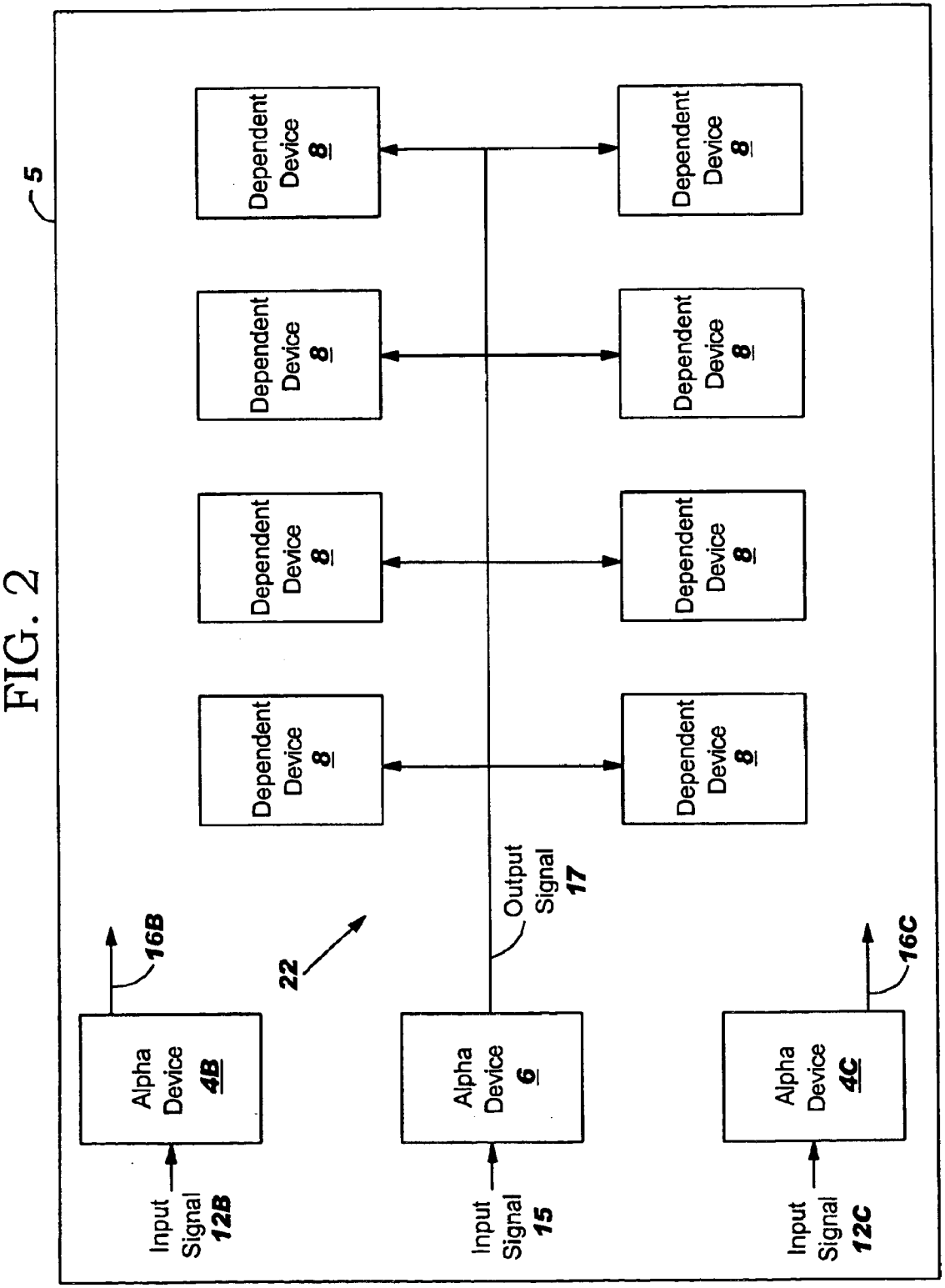
FIG. 2 illustrates a variation of FIG. 1, in accordance with embodiments of the present invention.

FIG. 2 illustrates a block diagram showing a group 22 comprising an alpha device 6 electrically connected to a plurality of dependent devices 8 for a manufacturing test, in accordance with embodiments of the present invention. In contrast to FIG. 1, the alpha device 6 in FIG. 2 comprises electrical characteristics that are different than those of alpha devices 4B and 4C. The alpha device 6 is compatible with the plurality of dependent devices 8 (i.e., comprise the same electrical characteristics) and therefore may be grouped together for the manufacturing test. The alpha device 6 and the plurality of dependent devices 8 are electrical devices. The alpha device 6 is required for operation of the plurality of dependent devices 8 during the manufacturing test. The alpha device 6 is adapted to accept an input signal 15 (e.g., input frequency) and apply an output control signal 17 (i.e., output frequency) to the plurality of dependent devices 8 during the manufacturing test. The Alpha device 6 and the plurality of dependent devices 8 are cores embedded within a semiconductor device 5. The semiconductor device 5 may be any semiconductor device known to a person of ordinary skill in the art including, inter alia, an application specific integrated circuit (ASIC), etc. The alpha devices 4B and 4C are as described in the description of FIG. 1. The input signals 12B and 12C are not equivalent with the input signal 15 (e.g., different frequencies). The alpha device 6 may be, inter alia, a phase lock loop (PLL) circuit (device), digital to analog convertor (DAC), analog to digital convertor (ADC), BIST engine, etc. Each of the plurality of dependent devices 8 may be, inter alia, an input/output (I/O) device, random access memory (RAM), etc. The I/O device may be, inter alia, a serializer/deserializer (SerDes). The plurality of dependent devices 8 are equivalent devices (i.e., they each comprise the same electrical characteristics). The manufacturing test may be designed such that the plurality of dependent devices 8 are tested simultaneously in parallel. The manufacturing test is used to test the plurality of dependent devices 8. The alpha device 6 is used to control the plurality of dependent devices 8 during the manufacturing test. To fulfil requirements for a proper manufacturing test, the alpha device 6 must be compatible with the plurality of dependent devices 8 (i.e., must comprise the same electrical characteristics). Additionally, pin to pin connections (operational) between the alpha device 6 and the plurality of dependent devices 8 must be known. An example of a manufacturing test is described by the following paragraph.

Assume for the following test that the alpha devices 6, 4B, and 4C are each high speed PLL circuits (i.e. speed at which PLL circuit ramps up input frequency (input signals 12A, 12B, and 15) to output frequency (output control signals 17, 16B, and 16C)). The alpha device 6 (PLL) comprises a 16×speed while the alpha devices 4B and 4C (PLL) each comprise an 8×speed. Additionally, each of the plurality of dependent devices 8 is a serializer/deserializer (SerDes) requiring a high frequency signal (i.e., output signal 17) to operate. High frequency is defined herein as a frequency selected from a range of about 1 gigahertz to about 6 gigahertz. The semiconductor device 5 is an ASIC. The manufacturing test is designed to test that the SerDes will properly operate at a specific frequency (i.e., frequency of output control signal 17 from the PLL circuit (alpha device 6)). Proper operation of the SerDes includes passing a signal (e.g., data) between an input and an output of the SerDes and a speed at which the signal is passed between the input and the output of the SerDes. If the SerDes are found to be operational within design tolerances then the manufacturing test is over and each SerDes may be disconnected from the PLL and reconnected to any associated circuitry on the ASIC to perform their intended (i.e., designed) function.

The present invention is a method of associative grouping an alpha device (e.g., alpha device 6) with associated dependent devices (e.g., the plurality of dependent devices 8) for a manufacturing test. The alpha devices 4B and 4C in FIG. 2 are not equivalent to the alpha device 6. Only the alpha device 6 is compatible with the plurality of dependent devices 8 so the alpha devices 4B and 4C may not be grouped with the plurality of dependent devices 8 for the manufacturing test (i.e., alpha devices 4B and 4C may not be interchanged with the alpha device 6 for the manufacturing test). Therefore, the method of associated grouping is required for FIG. 2 since only a specific (alpha 6 with dependents 8) group will work.

Figure 3:
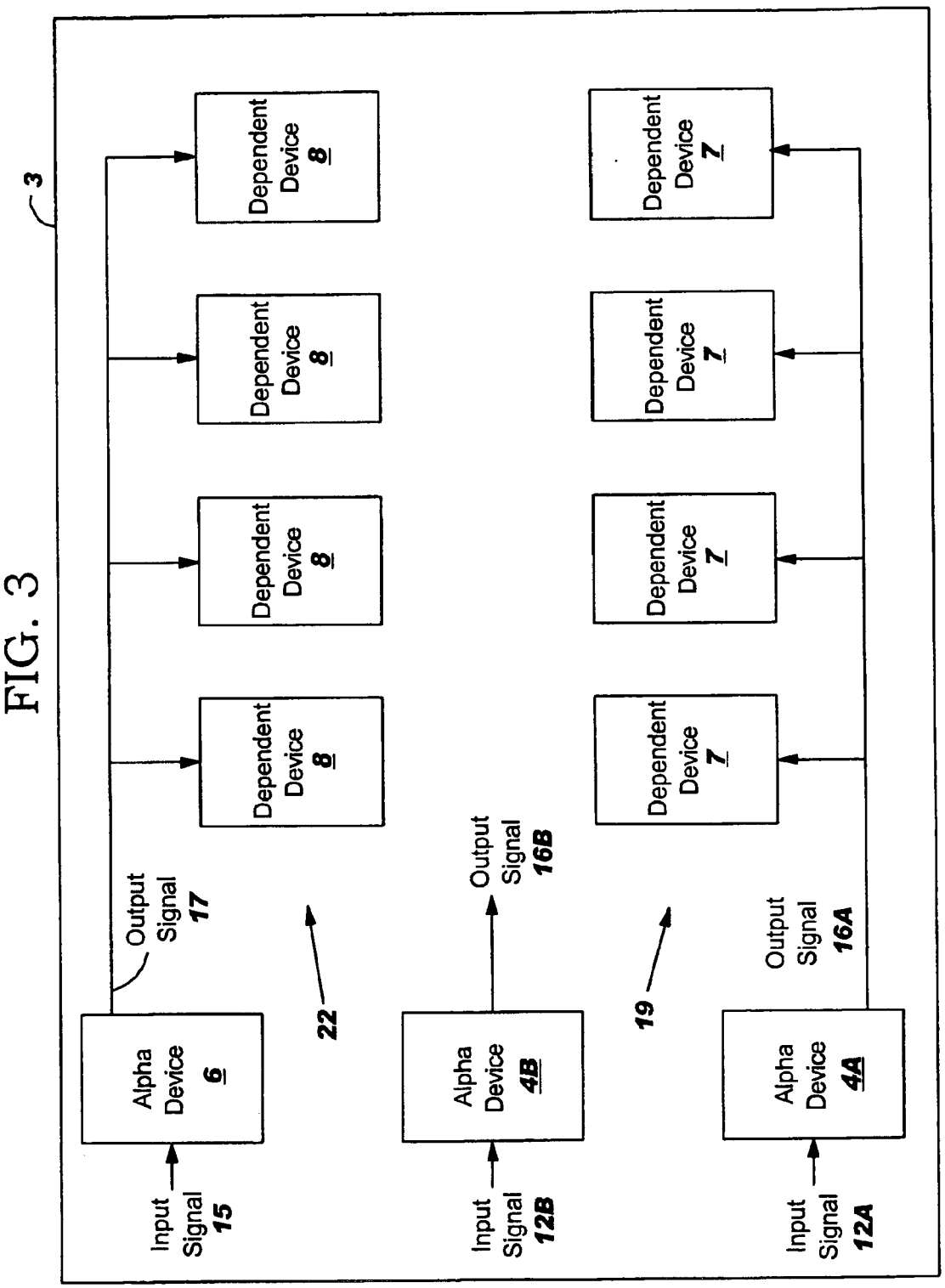
FIG. 3 illustrates a block diagram showing a combination of FIG. 1 and FIG. 2, in accordance with embodiments of the present invention.

FIG. 3 illustrates a block diagram showing a combination of FIG. 1 and FIG. 2 showing group 22 comprising the alpha device 6 electrically connected to the plurality of dependent devices 8 and the group 19 comprising the alpha device 4A electrically connected to the plurality of dependent devices 7 on a single semiconductor device 3 for a manufacturing test, in accordance with embodiments of the present invention. In contrast to FIG. 1 and FIG. 2, FIG. 3 comprises a plurality of different groups (i.e., group 19 and 22) on one semiconductor device (i.e., semiconductor device 3).

Figure 4:
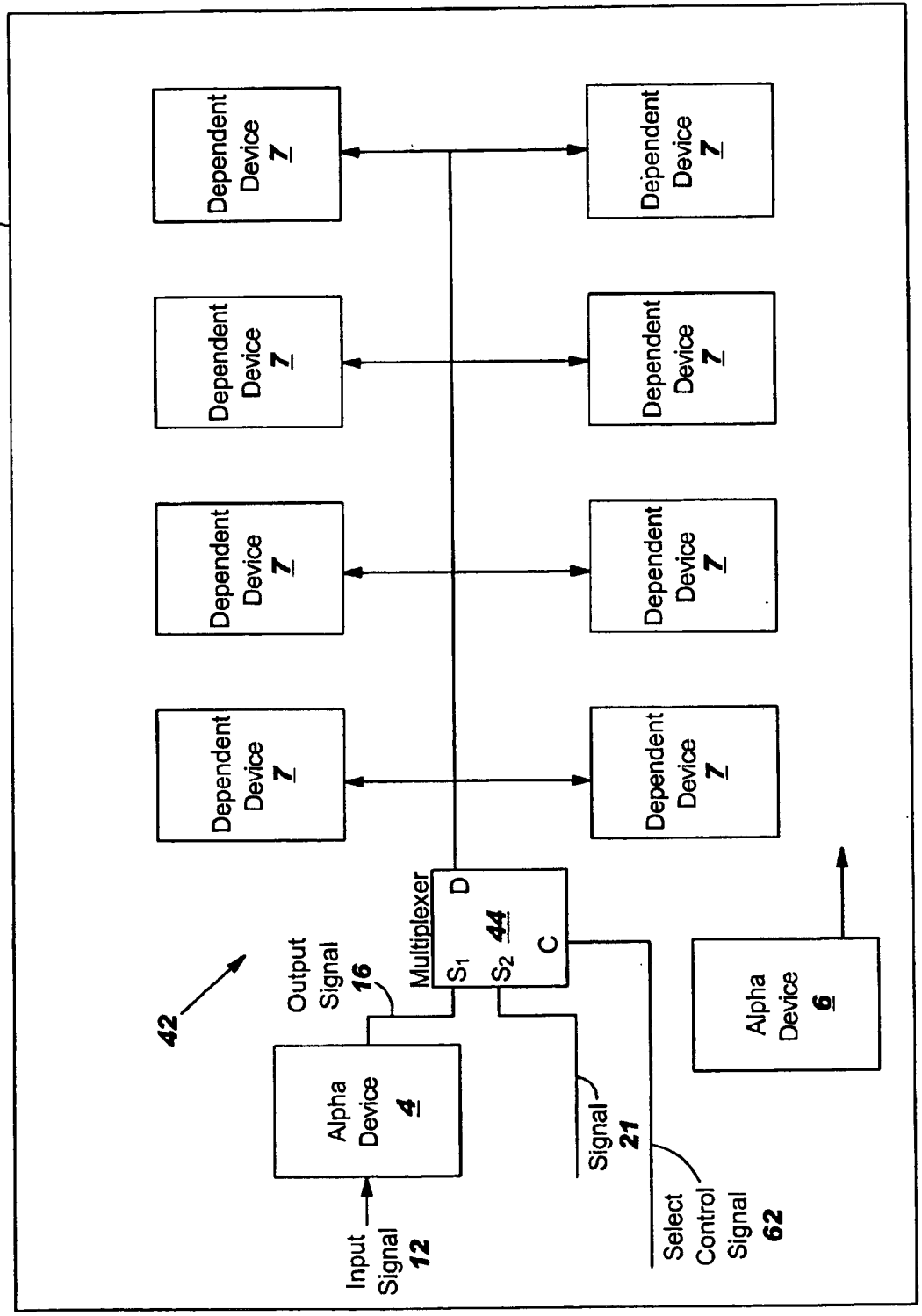
FIG. 4 is a modification of FIG. 1 illustrating a block diagram showing a group comprising the alpha device electrically connected to the plurality of dependent devices through a multiplexer for a manufacturing test, in accordance with embodiments of the present invention.

FIG. 4 is a modification of FIG. 1 illustrating a block diagram showing a group 42 comprising the alpha device 4 electrically connected to the plurality of dependent devices 7 through a multiplexer 44 for a manufacturing test, in accordance with embodiments of the present invention. In contrast to FIG. 1, FIG. 4 comprises the multiplexer 44 in the associative group 42. The multiplexer 44 is adapted to switch between signal 16 connected to input $S_1$ and signal 21 connected to input $S_2$ for the manufacturing test. The signal 21 may come from an oscillator circuit off chip (i.e., not on semiconductor device 25). The control input C of the multiplexer 44 is adapted to receive a select control signal 62. The select control signal 62 is adapted to control the switching between input $S_1$ and input $S_2$.

FIG. 5 illustrates a flowchart showing a process 70 for determining associative grouping for the groups 19, 22, and 42 in FIGS. 1–4, in accordance with embodiments of the present invention. In step 50, a first electrical device (e.g., dependent devices 7 or 8) and type of test to be performed (e.g., passing a signal (e.g., data) between an input and an output of a SerDes) is defined for manufacturing testing. If it is determined in step 52 that the first device may be tested stand alone (i.e., without any other devices) then an alpha device is not required for the manufacturing test. If it is determined in step 52 that the first device may not be tested stand alone then step 56 determines if a second device is required to apply control to the first device for the manufacturing test. If it is determined in step 56 that a second device is not required then an alpha device is not required. If it is determined in step 56 that a second device is required then the second device is defined as an alpha device and the first device is defined as a dependent device. If it is determined in step 62 that the alpha device may control a plurality of dependent devices then in step 64 the alpha device is associated and grouped with the plurality of dependent devices for manufacturing testing. If it is determined in step 62 that the alpha device may not control a plurality of dependent devices then only 1 to 1 grouping is allowed (i.e., only one alpha and one dependent is associatively grouped).

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method, comprising:
   identifying at least one electrical characteristic for an alpha device;
   identifying the at least one electrical characteristic for a plurality of dependent devices; and
   identifying a group comprising the alpha device and the plurality of dependent devices comprising the at least one electrical characteristic for associated manufacturing testing.

2. The method of claim 1, further comprising grouping the alpha device and the plurality of dependent devices together on a semiconductor device for the associated manufacturing testing.

3. The method of claim 2, wherein said grouping comprises electrically connecting the alpha device to the plurality of dependent devices during the associated manufacturing testing.

4. The method of claim 3, further comprising electrically disconnecting the alpha device from the plurality of dependent devices upon completion of the associated manufacturing testing.

5. The method of claim 2, further comprising providing by the alpha device, a first signal adapted to operate the plurality of dependent devices during the associated manufacturing testing.

6. The method of claim 5, further comprising providing a second signal adapted to operate the plurality of dependent devices during the associated manufacturing testing; and
   multiplexing between the first signal and the second signal during the associated manufacturing testing.

7. The method of claim 2, further comprising testing the plurality of dependent devices simultaneously in parallel during the associated manufacturing testing.

8. The method of claim 2, further comprising testing the plurality of dependent devices individually during the associated manufacturing testing.

9. The method of claim 2, wherein the alpha device and the plurality of dependent devices are cores on the semiconductor device.

10. The method of claim 2, wherein the semiconductor device is an application specific integrated circuit (ASIC).

11. The method of claim 1, wherein the at least one electrical characteristic comprises an operational frequency of the plurality of dependent devices.

12. The method of claim 11, wherein the operational frequency comprises a range of about 1 gigahertz to about 6 gigahertz.

13. The method of claim 1, wherein the at least one electrical characteristic comprises a jitter tolerance of the plurality of dependent devices.

14. The method of claim 1, wherein the alpha device comprises a phase lock loop circuit.

15. The method of claim 14, wherein each of the plurality of dependent devices comprise a serializer/deserializer (SerDes) circuit.

16. The method of claim 1, wherein the associated manufacturing testing comprises testing the plurality of dependent device for functional operation.

17. The method of claim 16, wherein the associated manufacturing testing comprises testing the plurality of dependent devices for the functional operation within a design specification.

18. The method of claim 17, wherein the design specification is a frequency range.

19. The method of claim 17, wherein the design specification is a speed at which the plurality of dependent devices perform the functional operation.

20. The method of claim 1, wherein the plurality of dependent devices is selected from the group consisting of an analog to digital convertor, a digital to analog convertor, and a BIST engine.

* * * * *